(12) United States Patent
Lin et al.

(10) Patent No.: US 6,967,155 B2
(45) Date of Patent: Nov. 22, 2005

(54) ADHESION OF COPPER AND ETCH STOP LAYER FOR COPPER ALLOY

(75) Inventors: Jing Cheng Lin, Chu Tung Zhen (TW); Ching-Hua Hsieh, Hsinchu (TW); Shau-Lin Shue, Hsinchu (TW); Mong-Song Liang, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/618,536

(22) Filed: Jul. 11, 2003

(65) Prior Publication Data

US 2005/0006776 A1 Jan. 13, 2005

(51) Int. Cl.[7] .......................................... H01L 21/4763
(52) U.S. Cl. ..................... 438/622; 438/625; 438/626; 438/627; 438/634; 438/637; 438/639; 438/660; 438/687
(58) Field of Search ................................. 438/618, 622, 438/625–627, 634, 637, 639, 660, 687

(56) References Cited

U.S. PATENT DOCUMENTS

| | | | |
|---|---|---|---|
| 6,054,769 A | 4/2000 | Jeng | 257/758 |
| 6,169,028 B1 | 1/2001 | Wang et al. | 438/653 |
| 6,274,499 B1 | 8/2001 | Gupta et al. | 438/692 |
| 6,309,970 B1 | 10/2001 | Ito et al. | 438/687 |
| 6,348,407 B1 | 2/2002 | Gupta et al. | 438/637 |
| 6,365,502 B1 | 4/2002 | Paranjpe et al. | 438/622 |
| 6,406,996 B1 | 6/2002 | Bernard et al. | 438/653 |
| 6,706,629 B1 * | 3/2004 | Lin et al. | 438/687 |
| 6,806,192 B2 * | 10/2004 | Lin et al. | 438/687 |

OTHER PUBLICATIONS

TSMC–01–1676, U.S. Appl. No. 10/361,732, filed Feb. 10, 2003, assigned to common assignee, "Barrier Free Copper Interconnect by Multi–Layer Copper Seed".

TSMC–02–338, U.S. Appl. No. 10/350,837, filed Jan. 24, 2003, assigned to common assignee, "Improved Method of Barrier–Less Integration with Copper Alloy".

* cited by examiner

*Primary Examiner*—Thien F Tran
(74) *Attorney, Agent, or Firm*—Haynes and Boone, LLP

(57) ABSTRACT

A new method and structure is provided for the creation of a copper dual damascene interconnect. A dual damascene structure is created in the layer of dielectric, optionally a metal barrier layer is deposited over exposed surfaces of the dual damascene structure. A copper seed layer is deposited, the dual damascene structure is filled with copper. An anneal is applied to the created copper interconnect after which excess copper is removed from the dielectric. Of critical importance to the invention, a thin layer of oxide is then deposited as a cap layer over the copper dual damascene interconnect, an etch stop layer is then deposited over the thin layer of oxide for continued upper-level metallization.

20 Claims, 7 Drawing Sheets

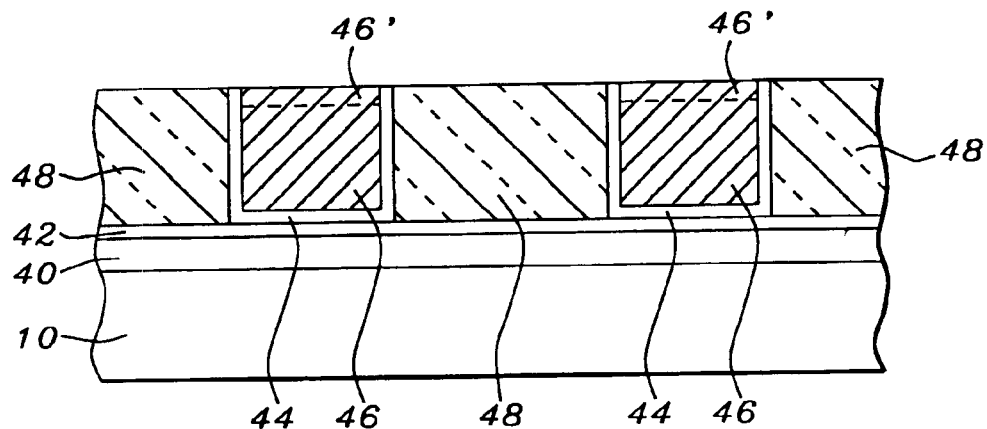
FIG. 1a - Prior Art
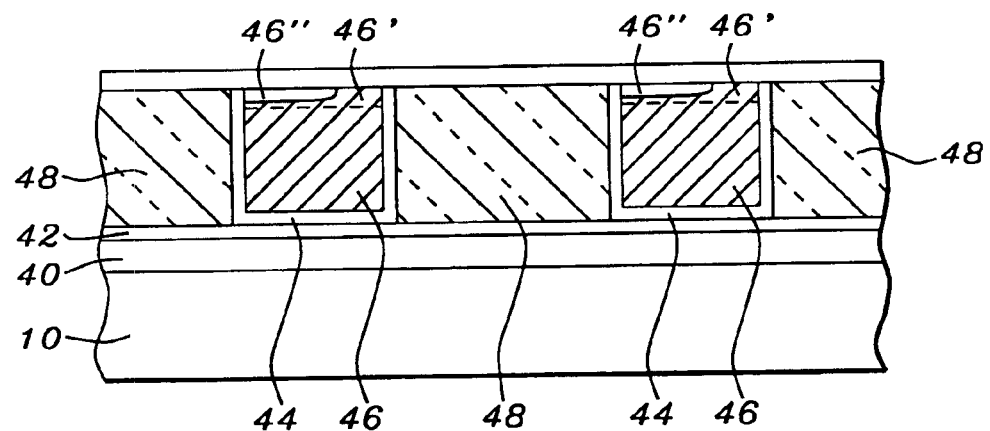
FIG. 1b - Prior Art a # ADHESION OF COPPER AND ETCH STOP LAYER FOR COPPER ALLOY

RELATED PATENT APPLICATION

This application is related to Ser. No. 10/361,732 (TS01–1676), filed on Feb. 10, 2003, and to Ser. No. 10/350,837 (TS02–338) filed on Jan. 24, 2003, assigned to common assignee.

BACKGROUND OF THE INVENTION (1) Field of the Invention

The invention relates to the fabrication of integrated circuit devices, and more particularly, to a method of improving copper interconnect reliability performance by improving the adhesion between the copper of the copper interconnect and a barrier layer.

(2) Description of the Prior Art

Performance improvements of Integrated Circuits are typically achieved by device miniaturization, which concurrently results in increasing the packaging density of the created Integrated Circuits. Methods and materials that are applied for interconnecting Integrated Circuits are therefore becoming an increasingly more importance part of creating packaged semiconductor devices.

The selection of insulation materials and the selection of the materials that are used for the creation of interconnect metal continue to be explored as part of a continuing effort to improve device performance. In this respect for instance methods and materials are explored that allow for the creation of low-k dielectric interfaces between adjacent layers of interconnect metal. In addition, the materials that are used for the creation of the interconnect metal, such as interconnect vias and interconnect traces, continues to present a challenge.

For the use as an interconnect medium, copper has increasingly gained acceptance and is increasingly being used for this purpose. Copper is known to have low cost and a low resistivity, copper however has a relatively large diffusion coefficient into silicon dioxide and silicon. Copper from an interconnect may diffuse into a surrounding silicon dioxide layer, causing the dielectric to become conductive and decreasing the dielectric strength of the silicon dioxide layer. Copper interconnects are therefore conventionally encapsulated by at least one layer of diffusion barrier material that prevents diffusion of the copper into the surrounding dielectric such as a layer of silicon dioxide. Silicon nitride is frequently used as a diffusion barrier layer for copper, the disadvantage of this approach however is that metal interconnects preferably should not lie over a silicon nitride layer since the silicon nitride layer has a high dielectric constant when compared with silicon dioxide, causing an undesirable increase in the capacitance between the interconnect metal and the underlying substrate.

Copper is also known to have low adhesive strength to various insulating layers and is difficult to pattern by masking and etching a blanket layer of copper in order to create intricate structural circuit elements.

To create conductive interconnect lines and vias, the damascene or dual damascene process is frequently used. For the creation of Very and Ultra Large Scale Integrated devices using the dual damascene process, a layer of insulating or dielectric material is patterned and developed, creating several thousand openings there-through for conductive interconnect traces and vias. These openings are simultaneously filled with a metal, conventionally aluminum with more recent developments using copper. The created metal interconnects serve to interconnect active and/or passive elements of the Integrated Circuit.

Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed.

The invention concentrates on using copper as a metal interconnect medium, a dual damascene pattern of copper is first created and annealed. After this, and of critical importance to the invention, a thin layer of oxide is deposited as a cap layer after which a layer of etch stop material is deposited over the thin layer of oxide.

U.S. Pat. No. 6,406,996 B1 (Bernard et al.) shows copper dual damascene interconnects with sub cap and cap layers.

U.S. Pat. No. 6,169,028 B1 (Wang et al.) shows an oxide cap over a copper dual damascene interconnect.

U.S. Pat. No. 6,309,970 B1 (Ito et al.) shows a copper oxide on a copper surface.

U.S. Pat. No. 6,274,499 B1 (Gupta et al.) shows a dielectric cap over an interconnect.

SUMMARY OF THE INVENTION

A principal objective of the invention is to provide a copper interconnect of improved adhesion between the copper interconnect and an overlying cap layer of for instance etch stop material.

Another objective of the invention is to provide a copper interconnect of increased reliability performance.

In accordance with the objectives of the invention a new method and structure is provided for the creation of a copper dual damascene interconnect. A dual damascene structure is created in the layer of dielectric, optionally a metal barrier layer is deposited over exposed surfaces of the dual damascene structure. A copper seed layer is deposited, the dual damascene structure is filled with copper. An anneal is applied to the created copper interconnect after which excess copper is removed from the dielectric. Of critical importance to the invention, a thin layer of oxide is then deposited as a cap layer over the copper dual damascene interconnect, an etch stop layer is then deposited over the thin layer of oxide for continued upper-level metallization.

BRIEF DESCRIPTION OF THE DRAWINGS

FIGS. 1a and 1b show cross sections of conventional creation of a copper interconnect.

DESCRIPTION OF THE PREFERRED EMBODIMENTS

Figure 2:
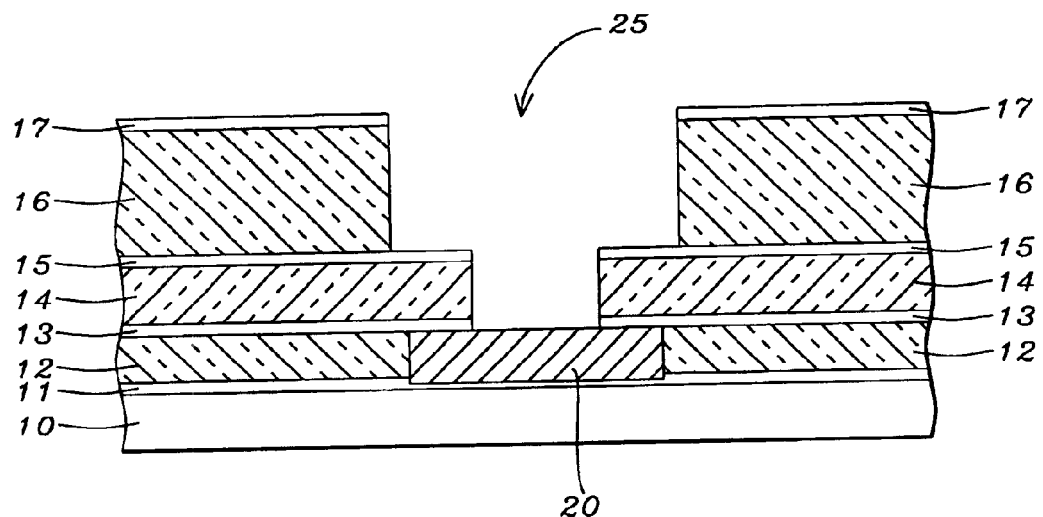
FIG. 2 shows a cross section of a semiconductor substrate over the surface of which a first level of metal is available, layers of dielectric have been deposited, an opening for a copper interconnect has been created through the multiple layers of dielectric. The created opening has a cross section of a dual damascene structure.

Copper, as previously stated, suffers from high diffusivity in common insulating materials such as silicon oxide and oxygen-containing polymers. For instance, copper tends to diffuse into polyimide during high temperature processing of the polyimide.

This causes severe corrosion of the copper and the polyimide due to the copper combining with oxygen in the polyimide. This corrosion may result in loss of adhesion, delamination, voids, and ultimately a catastrophic failure of the component. Copper interconnects are therefore conventionally encapsulated in at least one diffusion barrier to prevent diffusion into the surrounding layer of dielectric such as a layer of silicon dioxide.

A typical barrier layer is formed using rf sputtering of titanium nitride, tantalum, tungsten, niobium, molybdenum, Ti/TiN or Ti/W and is more preferably formed using TiN. The barrier layer can also be used to improve the adhesion of a subsequent overlying tungsten layer. A barrier layer is preferably about 100 and 500 Angstrom thick and more preferably about 300 Angstrom thick. The addition of a barrier layer has a negative impact on device performance by increasing contact resistance and series resistance of the in this manner created copper interconnect. These negative effects are to be avoided, more so in the era of sub-micron and deep sub-micron device feature sizes since this negative impact has a proportionally larger negative impact on the performance of these devices.

To further enhance the adhesion of a copper interconnect line to the surrounding layer of dielectric or insulation, a seed layer is typically deposited over the barrier layer. A conventional seed layer can be deposited using a sputter chamber or an Ion Metal Plasma (IMP) chamber at a temperature of between about 0 and 300 degrees C. and a pressure of between about 1 and 100 mTorr, using copper or a copper alloy as the source at a flow rate of between about 10 and 400 sccm and using argon as an ambient gas. The minimum thickness of a seed layer is about 50 Angstrom, this thickness is required to achieve a reliable gap fill.

Conventional creation of damascene or dual damascene interconnects are first highlighted using FIGS. 1a and 1b. Specifically referring to the cross section that is shown in FIG. 1a, therein is highlighted a semiconductor substrate 10 over which a layer 40 of stress relieve silicon dioxide has been created. Layer 42 is a layer of conventional etch stop material, layer 44 shown in cross section in FIGS. 1a and 1b represents the combination of an (optional) barrier layer over which a layer of copper seed is deposited. The openings created in layer 48 of dielectric, which are presented as being representative of single or dual damascene structures, are then filled with layer 46 of copper, applying conventional methods of metal deposition such as ECP. After the openings have been filled with layers 46 of copper, a thermal anneal is typically applied to the created structure, more specifically to the deposited layer 46 of copper. Excess copper (not shown) that has accumulated over the surface of layer 48 of dielectric is removed, applying preferably well-known methods of Chemical Mechanical Polishing (CMP) or surface etch.

The cross section shown in FIG. 1a is the result of the above highlighted steps, showing two copper interconnects 46 created in a layer 48 of dielectric.

As seed layer 44 a doped copper is frequently used, one of the advantages of using doped copper is that the minority element in the doped copper, that is the doping element, improves the adhesion between the copper of the copper interconnect and the layer of metal barrier material, in this manner improving the reliability of the created copper interconnect.

Using conventional methods however, as shown in the cross section of FIG. 1a, does not make use of the observation that the minority element in the doped copper can form a metallic oxide, such a $MgO_x$, with oxide containing elements of an overlying layer of dielectric. The invention provides a method whereby this latter observation is advantageously applied in the creation of copper interconnects.

By depositing a thin layer of silicon oxide over the surface of the completed copper interconnect, the invention provides an interface between the copper interconnect and the thin layer of oxide where the minority element of the doped copper (of the seed layer) can readily form a metallic oxide over the surface of the created copper interconnect, improving the surface quality of the created copper interconnect and therewith reducing electromigration through this surface and further improving adhesion to the surface of the copper interconnect.

The region 46', highlighted in FIG. 1a, is highlighted in order to indicate a high gradient of magnesium that is (mostly) concentrated in the upper extremity of layers 46. This Mg diffuses, as a result of an anneal of the structure of for instance 400 degrees C. applied for about 2 minutes, to the surface of copper interconnects 46.

The conventional results of the presence of the high-concentration of Mg in the surface of copper interconnects 44 results in the surface disturbance or irregularity 46" shown in cross section in FIG. 1b.

The super-saturated Mg, layer 46' in the cross sections of FIGS. 1a and 1b, will try to find a weak diffusion path in order to reach a balance in the concentration balance of Mg. Surface disturbances 46" result in poor adhesion between the surface of the copper interconnect layers 46 and an overlying layer 50, FIG. 1b, of etch stop material. In FIG. 1b, the layer 50 of etch stop material has been deposited over the surface of the created copper interconnects, serving as an etch stop for continued, Back-End-Of-Line (BEOL) metallization.

The invention, shown using FIGS. 2 through 8, starts with, as shown in the cross section of FIG. 2, a blanket unprocessed semiconductor substrate 10 over which is created a interconnect structure through successive overlying layers of dielectric.

Shown in the cross section of FIG. 2 is a layer 11, which represents the layer of semiconductor devices that is created in or over the surface of substrate 10. The electrical point of first level copper contact 20 is representative of the points of electrical contact provided in the surface of substrate 10 that provide access to the semiconductor devices created in or over the surface of substrate 10 as represented by layer 11.

Further shown in the cross section of FIG. 2 are a first layer 12 of dielectric, a second layer 14 of dielectric and a third layer 16 of dielectric. Overlying the three layers of dielectric are a first layer 13 of etch stop material, a second layer 15 of etch stop material and a third layer 17 of etch stop material. Opening 25, created through the layers of dielectric and etch stop material as shown in the cross section of FIG. 2, will be recognized as having the cross section of a dual damascene structure. Conventional methods of photolithographic exposure and development are used to create opening 25, opening 25 exposes the surface of copper contact point 20.

Layers 12, 14 and 16 of dielectric are preferably formed using a low-k dielectric material.

Figure 3:
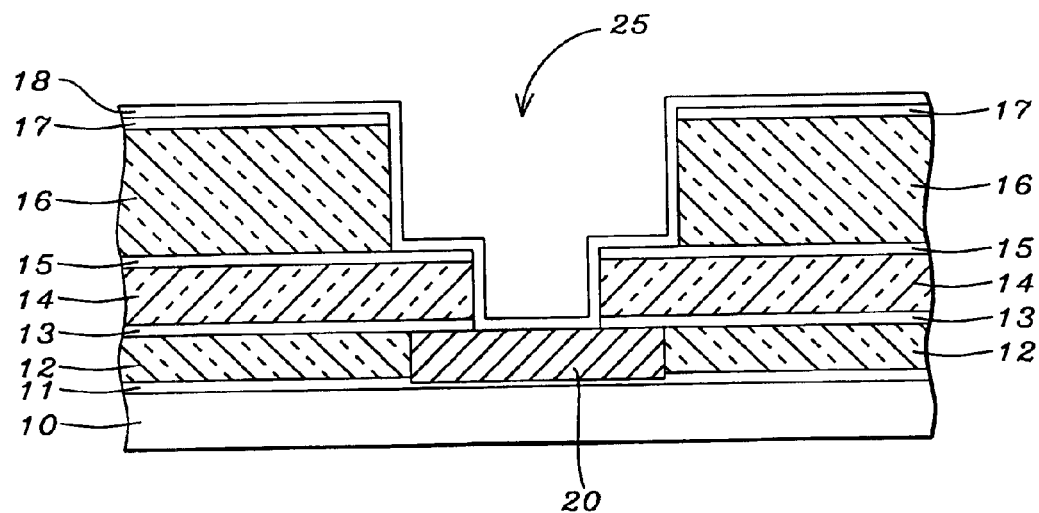
FIG. 3 shows the cross section of the semiconductor substrate after (optionally) a layer of barrier material has been deposited.

As a next step, as shown in the cross section of FIG. 3, a layer 18 of barrier material is optionally deposited over inside surfaces of opening 25 and over the surface of the patterned and etched layers of dielectric. Layer 18 is typically deposited using methods of CVD, to a preferred thickness of between about 50 and 300 Angstrom. The layer 18 of metal barrier material preferably comprises Ta, TaN or TiN.

Figure 4:
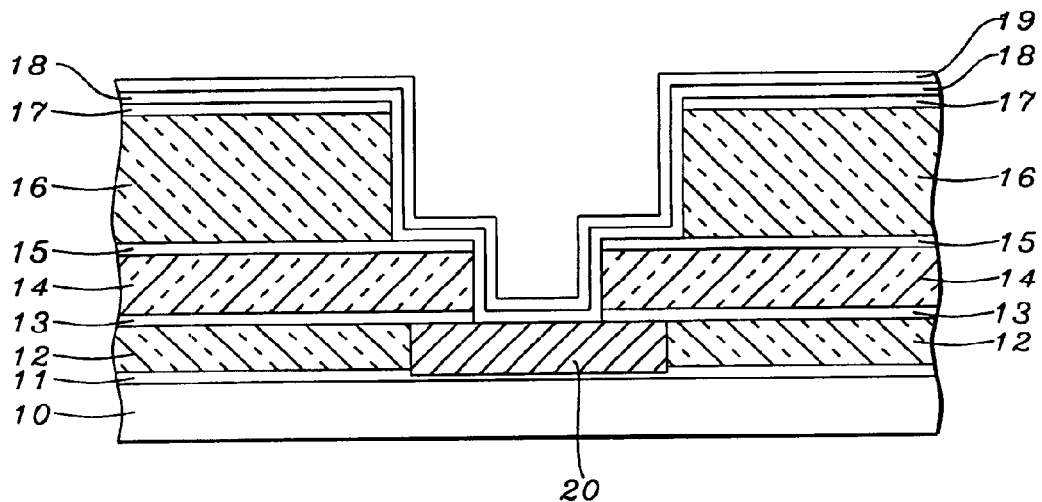
FIG. 4 shows a cross section after a seed layer of doped copper has been deposited.

As a next step, shown in cross section in FIG. 4, a layer 19 of copper seed material, preferably comprising doped copper, is deposited over the surface of the barrier layer 18, this deposition is performed to a preferred thickness of between about 50 and 300 Angstrom. Layer 19 is referred to as a seed layer for a thereover to be created copper interconnect.

The layer 19 of doped copper may, herewith highlighting doping materials as examples without however being limited to these materials, be doped by Cr, Pd, Sn, Ti, Zr, Mg, Al. The doped copper layer 19 therefore may comprise CuCr, CuPd, CuSn, etc., in accordance with the listed doping elements.

Figure 5:
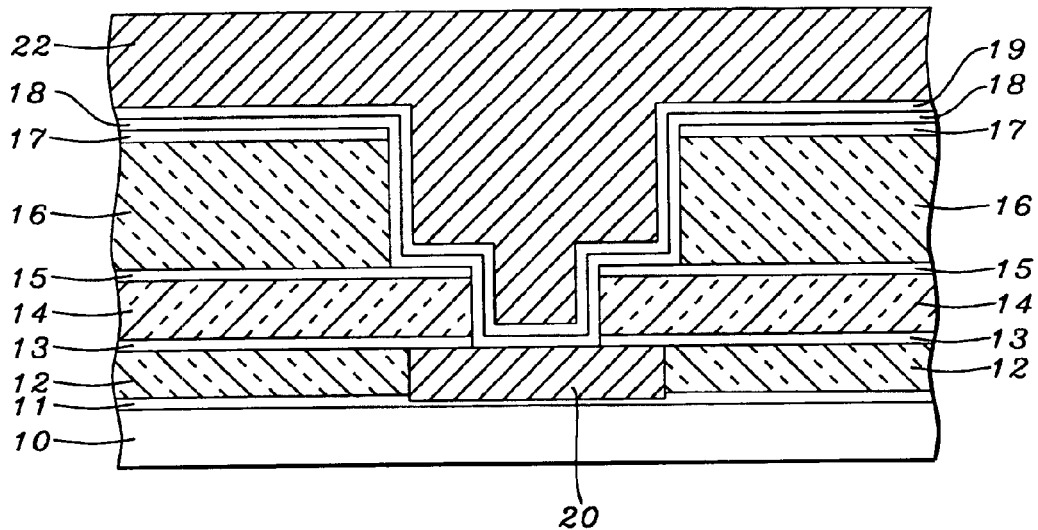
FIG. 5 shows a cross section after a layer of copper has been deposited over the doped copper seed layer, filling the opening created through the layers of dielectric. An anneal is preferred to be applied to the shown structure at this time.

The structure that is shown in cross section in FIG. 4 is now ready for the deposition of a layer 22, FIG. 5, of copper thereover, using conventional methods of metal deposition such as ECP, filling opening 25 in addition to depositing copper over the surface of layer 19 of doped copper seed.

After the structure that is shown in cross section in FIG. 5 has been created, a Rapid Thermal Anneal is applied, resulting in copper stabilization and the stimulation of an interaction between the doped elements in layer 19 and the sidewalls of the dielectrics 14 and 16. This interaction forms, in the interface between layer 19 and the surrounding dielectrics 14 and 16 of low-k dielectric material, oxide compounds such as $MgO_x$, $AlO_x$, $HfO_x$, $TiO_x$, $ZrO_x$ and the like, dependent on the doping element that has been provided as a dopant in layer 19.

The Rapid Thermal Anneal can be performed applying a temperature of no less than about 350 degrees C. for a time of no less than about 10 minutes.

Figure 6:
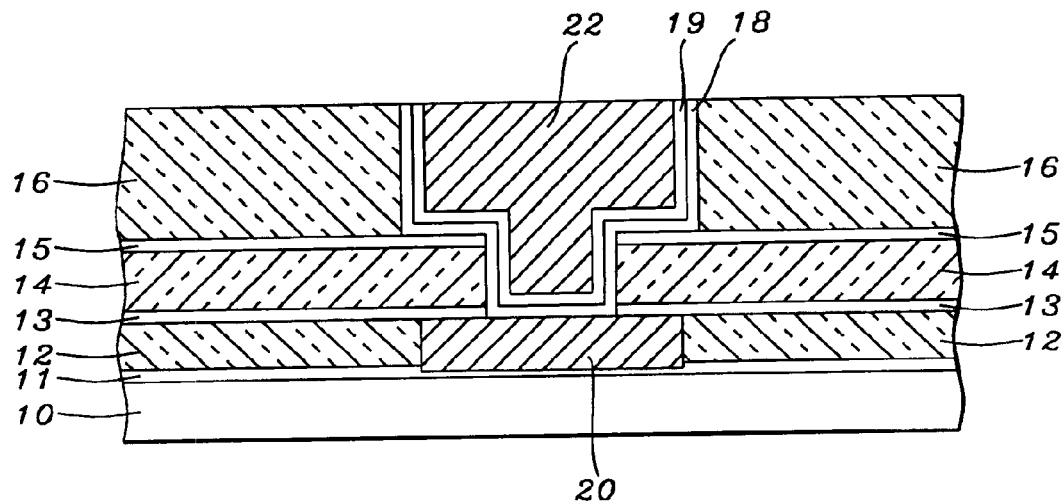
FIG. 6 shows a cross section after polishing of the deposited layer of copper, including the doped copper seed layer and the (optional) barrier layer.

By now removing the deposited layer 22 of copper, the layers 18/19 of doped copper and (optional) barrier material and the layer 17 of etch stop material from above the surface of layer 16 of dielectric, applying for this purpose preferably methods of Chemical Mechanical Polishing (CMP), the structure that is shown in cross section in FIG. 6 is obtained.

Figure 7:
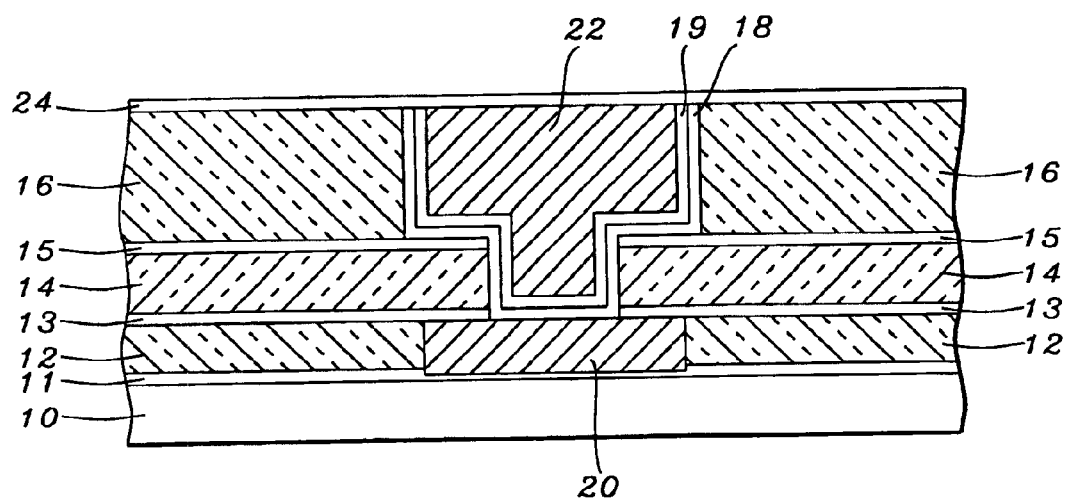
FIG. 7 shows a cross section after, of critical importance to the invention, a cap layer of oxide has been deposited over the surface of the layers of dielectric, including the surface of the therein created copper interconnect.

As a next and critically important steps of the invention, FIG. 7, a thin layer 24 of oxide is created over the surface of the created copper interconnect 22 and the top layer 16 of low-k dielectric.

As an example of the deposition of a thin layer 24 of oxide can be cited a Plasma Enhanced CVD (PECVD) of oxide, accomplished at a chamber pressure between about 1 and 3 Torr, a temperature between about 300 and 500 degrees C., using oxygen as a source at a flow rate between about 10 and 2000 sccm and an rf power between about 50 and 2000 KeV to a thickness between about 50 and 300 Angstrom.

Experimental results have confirmed that, for instance, the Mg of the doped seed layer is trapped by the layer 24 of silicon oxide, preventing out-diffusion of the Mg and preventing leakage through the surface of the created copper interconnects. The element Mg reacts with the thereover deposited film 24 of silicon oxide, forming $MgO_x$, and stopping at the interface with a thereover deposited layer of etch stop material.

It must be pointed out that the doping element and the concentration of the doping element in the seed layer 19 must be carefully controlled. If the level of doping in the seed layer 19 is too high, severe leakage may be introduced by the doping element, originating in the created interconnect 22 of copper.

Figure 8:
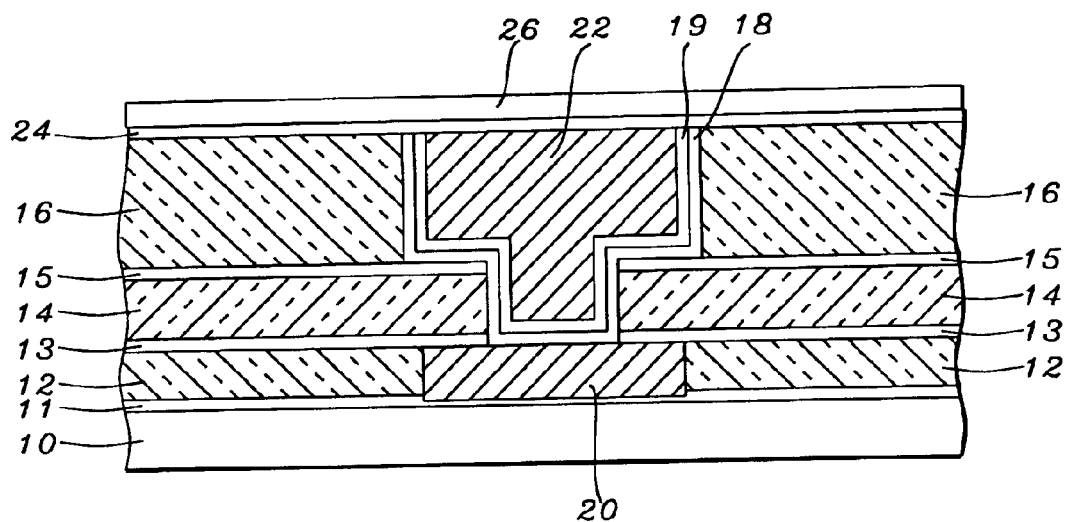
FIG. 8 shows a cross-section after an etch stop layer has been deposited.

The invention completes the creation of copper interconnects and prepares for further, additional levels of metallization by depositing a layer 26, FIG. 8, of etch stop material over the created thin layer 24 of oxide. Upper levels of metallization can now be performed using conventional BEOL processing. For layer 26 a conventional etch stop material may be used such as SiN or SiC or SiCN.

Figure 9:
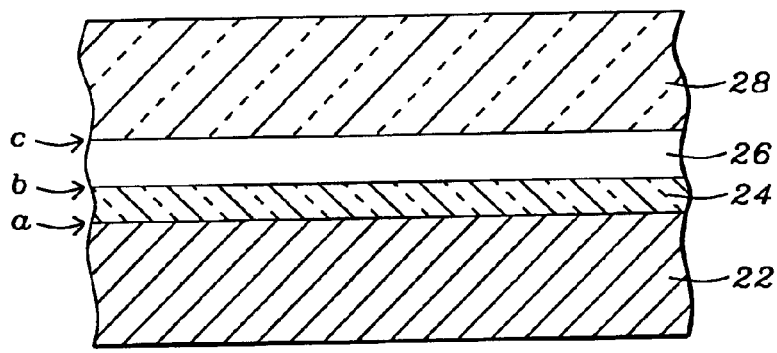
FIGS. 9–12 show results of measurements relating to the invention.

To further confirm the effectiveness of the layer of oxide that is deposited over the created copper interconnects, measurements that relate to the dual damascene structure created by the invention are shown in FIGS. 9 through 12. As a basis for these measurements, a cross section is shown in FIG. 9 in which the now familiar layers 22, 24 and 26 will be recognized in similarity to the cross section of theses layers shown in FIG. 8. Over the surface of layer 26 an additional layer 28 of dielectric is deposited, this layer is used for creating BEOL metallization therein or there over. Surface area "a" is the surface where layer 22 of copper interfaces with layer 24 of oxide, surface area "b" is the surface where layer 24 of oxide interfaces with layer 26 of etch stop material while surface area "c" is the surface where layer 26 of etch stop material interfaces with layer 28 of dielectric.

Figure 10:
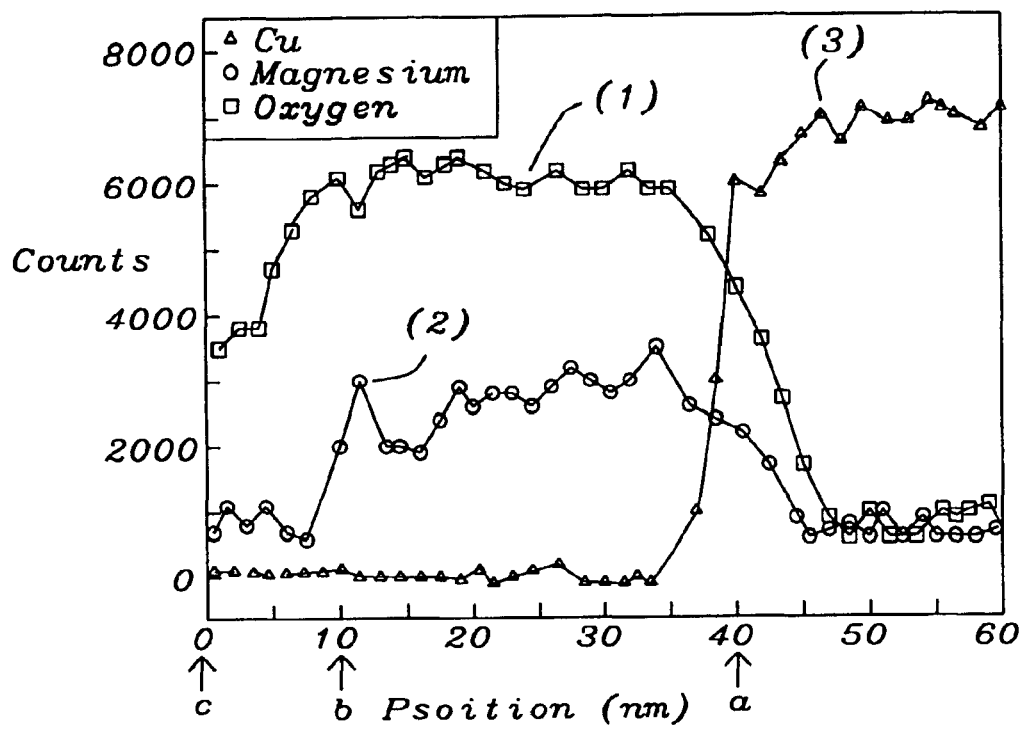

Surface interfaces "a", "b" and "c" are indicated in the graphic depiction of FIG. 10 along the horizontal or X-axis of the graph. Along the X-axis of the graph of FIG. 10, the region to the right of point "a" relates to copper layer 22 of FIG. 9, the region between points "a" and "b" relates to layer 24 of oxide of FIG. 9, the region between point "b" and "c" is representative of measurements that relate to the layer 26 of etch stop material.

Along the vertical or Y-axis of FIG. 10 is plotted the particle counts, presented in three curves 1, 2 and 3, whereby:

curve 1 presents the particle count of oxygen in the respective layers 22, 24 and 26, curve 2 presents the particle count of magnesium in the respective layers 22, 24 and 26, and curve 3 presents the particle count of copper in the respective layers 22, 24 and 26.

The measurements that are shown in FIG. 10 are not surprising where these measurements relate to particles that are the basic elements of a layer. For instance, curve 3 shows a high copper particle count for layer 22 to the right of point "a", which is to be expected since this is the copper interconnect. Curve 1 shows a high oxygen particle count between points "b" and "c" for layer 24, which again is not surprising since this layer of the thin layer of oxide.

What however is more indicative of the effectiveness of the layer 24 of oxide is the particle count of magnesium, curve 2, for the various layers of the structure that is shown in cross section in FIG. 9. This magnesium particle count is very low for layer 26, between points "b" and "c" and for layer 22, to the right of point "a". The magnesium particle count is high for layer 24, of oxide, between points "a" and "b". This shows that the magnesium is, by means of layer 24 of oxide, effectively blocked from penetrating into layer 26 and is essentially concentrated (blocked) in layer 24 of oxide.

As a further confirmation of the value of the invention, leakage currents have been measured, these measurements being line-to-line leakage currents between adjacent dual damascene interconnects created using the invention.

Figure 11:
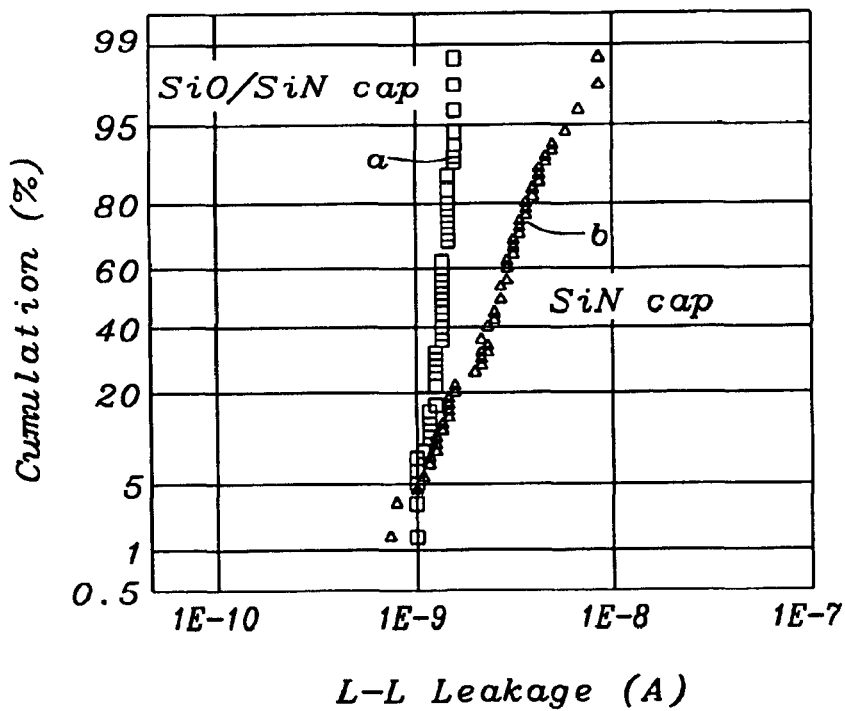
Figure 12:
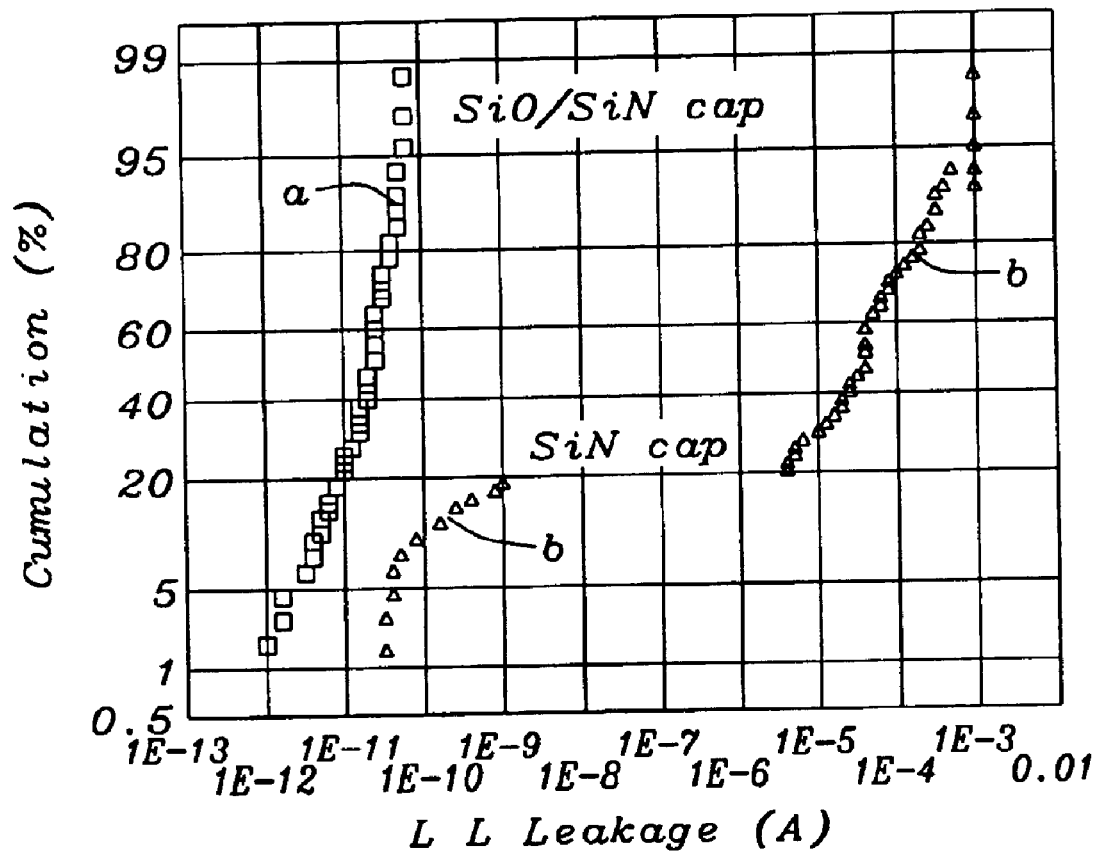

Both FIGS. 11 and 12 show line-to-line leakage current, the fundamental difference between the presentations of FIGS. 11 and 12 is that FIG. 11 presents line-to-line leakage currents before the thermal anneal process while FIG. 12 presents line-to-line leakage currents after the thermal anneal process. The anneal process is applied as part of the sequential processing steps for the creation of conductive copper interconnects, FIG. 12 curve "b" highlights interconnect failure (due to excessive line-to-line leakage current) after thermal anneal has been applied.

Curves "a" and "b" in both FIGS. 11 and 12 are measurements taken with the same cap layer, whereby curve "a" presents the leakage current with a SiO cap (layer 24) over which a SiN layer (layer 26) is deposited, for curve "b" only a SiN cap (layer 26) is applied. It is from this clear that the SiO cap, layer 24, significantly reduces leakage current, an effect that takes on more dramatic meaning in the curves shown in FIG. 12, where curve "b", which represents a surface of a copper interconnect that is capped only with a layer of SiN and not with the layer 24 of oxide of the invention, shows a significant increase in the amount of line-to-line leakage current, confirming the presence of surface irregularities 46" shown in conventional art application of FIG. 1b. The sharply reduced line-to-line leakage current of curve "a", FIG. 12, confirms the validity of the application of layer 24 of oxide.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a copper interconnect, comprising:
    providing a substrate, semiconductors having been provided in or over the substrate, at least one contact point of first level copper having been provided in or over the substrate;
    creating at least one interconnect opening through selected layers of material over the substrate aligned with the at least one contact point;
    filling the at least one interconnect opening with copper after sidewalls of the at least one interconnect opening have been lined with a doped copper seed layer, creating at least one copper interconnect;
    applying an anneal to the copper in the at least one interconnect opening and the doped copper seed layer;
    depositing an oxide based layer over the selected layers of material and the at least one copper interconnect; and
    depositing a cap layer over the oxide based layer.

2. The method of claim 1, the selected layers of material comprising at least one layer of etch stop material and at least one layer of low-k dielectric.

3. The method of claim 1, additionally lining sidewalls of the at least one interconnect opening with a layer of barrier material prior to lining sidewalls of the at least one interconnect opening with the doped copper seed layer.

4. The method of claim 1, wherein a profile of the at least one interconnect opening is a single damascene profile, a dual damascene profile, a contact opening profile or a via opening profile.

5. The method of claim 1, the oxide based layer comprising silicon oxide, deposited to a thickness between about 50 and 300 Angstrom.

6. The method of claim 1, wherein the cap layer is an etch stop material.

7. A method for the creation of a copper in interconnect, comprising:
    providing a substrate, semiconductors having been provided in or over the substrate, at least one contact point of first level copper having been provided in or over the substrate;
    creating at least one interconnect opening through selected layers of material over the substrate aligned with the at least one contact point;
    depositing a doped copper seed layer over the selected layers of material, including inside surfaces of the at least one interconnect opening;
    depositing a layer of copper over the doped copper seed layer, filling the at least one interconnect opening;
    applying an anneal to the substrate and thereover created layers;
    removing excess copper and the seed layer from the selected layers of material, creating at least one copper interconnect;
    depositing an oxide based layer over the selected layers of material, including the at least one copper interconnect; and
    depositing a cap layer over the oxide based layer.

8. The method of claim 7, the selected layers of material comprising at least one layer of etch stop material and at least one layer of low-k dielectric.

9. The method of claim 7, the doped copper seed layer comprising a doping element selected from the group consisting of Cr, Pd, Sn, Ti, Zr, Mg, Al.

10. The method of claim 7, the doped copper seed layer being deposited to a thickness between about 50 and 300 Angstrom.

11. The method of claim 7, the anneal comprising applying about 400 degrees C applied for about 2 minutes.

12. The method of claim 7, the removing excess copper comprising methods of Chemical Mechanical Polishing or surface etch.

13. The method of claim 7, the depositing an oxide based layer comprising a plasma enhanced CVD (PECVD) of oxide to a thickness between about 50 and 300 Angstrom.

14. The method of claim 7, the etch stop layer comprising a material selected from the group consisting of SiN and SiC and SiCN.

15. The method of claim 7, the oxide based layer comprising silicon oxide.

16. The method of claim 7, wherein a profile of the at least one interconnect opening is a single damascene profile, a dual damascene profile, a contact opening profile or a via opening profile.

17. The method of claim 7, wherein the cap layer is an etch stop material.

18. The method of claim 7, additionally depositing a layer of barrier material over the selected layers of material, including inside surfaces of the at least one interconnect opening, prior to the depositing a doped copper seed layer.

19. The method of claim 18, wherein the layer of barrier material is Ta, TaN or TiN.

20. The method of claim 18, the layer of barrier material being deposited to a thickness between about 50 and 300 Angstrom.

* * * * *